United States Patent [19]

Adham

[11] 4,373,778
[45] Feb. 15, 1983

[54] CONNECTOR IMPLEMENTED WITH FIBER OPTIC MEANS AND SITE THEREIN FOR INTEGRATED CIRCUIT CHIPS

[75] Inventor: Jawad F. Adham, Vestal, N.Y.

[73] Assignee: International Business Machines Corporation, Armonk, N.Y.

[21] Appl. No.: 221,678

[22] Filed: Dec. 30, 1980

[51] Int. Cl.³ .............................................. G02B 7/26
[52] U.S. Cl. ................................ 350/96.20; 250/227; 339/17 R
[58] Field of Search ..................... 350/96.20; 250/227; 339/17 R, 17 C, 17 CF, 17 D, 17 E

[56] References Cited

U.S. PATENT DOCUMENTS

| | | | |
|---|---|---|---|
| 2,416,887 | 3/1947 | Tibbetts | 310/328 X |
| 3,879,606 | 4/1975 | Bean | 250/227 |
| 3,904,262 | 9/1975 | Cutchaw | 339/17 CF |
| 3,963,920 | 6/1976 | Palmer | 250/239 |
| 3,969,816 | 7/1976 | Swengel, Sr. et al. | 29/625 |
| 4,030,190 | 6/1977 | Varker | 29/625 |
| 4,063,791 | 12/1977 | Cutchaw | 339/17 CF |
| 4,081,208 | 3/1978 | Meade | 350/96.20 |
| 4,164,003 | 8/1979 | Cutchaw | 361/403 |
| 4,166,665 | 9/1979 | Cutchaw | 339/112 L |
| 4,225,213 | 9/1980 | McBride, Jr. et al. | 350/96.20 |

FOREIGN PATENT DOCUMENTS 3004379 8/1980 Fed. Rep. of Germany ... 350/96.20

OTHER PUBLICATIONS

Albanese et al, "Led Array Package for Optical Data Links," *Bell Syst. Tech. Journal*, vol. 58, No. 3, Mar. 1979, pp. 713-720.
Redmond, "Completely Integrated Fiber-Optic Link," *IBM Tech. Discl. Bull.*, vol. 22, No. 9, Feb. 1980, pp. 3975-3976.
Noel et al, "High Density Fiber-Optic Transducer Modules," *IBM Tech. Discl. Bull.*, vol. 22, No. 11, Apr. 1980, pp. 4857-4858.

Primary Examiner—John D. Lee
Attorney, Agent, or Firm—Saul A. Seinberg

[57] ABSTRACT

A single level packaging arrangement and connector for large or very large scale integrated circuit chips is disclosed. This arrangement utilizes dual function optical transducers and fiber optic cables as the transmission medium by which most, if not all, chip I/O communication is effected.

The top portion of the connector acts as a conductive collar which serves as both a heat sink and a shield against stray external signals. A chip site is formed in the top portion of the connector and the chip removably lodged therein. The top portion of the connector also includes connector pads which are utilized to make solderless connection to deformable chip pads and to dual purpose optical transducers. Thermal grease, which is forced into and fills site cavities provided for that purpose, assists in conducting heat from within the connector to thereby enhance the heat dissipation characteristics of the chip site. The chip itself is retained in the site by the use of wedges and retaining strips secured to the connector at appropriate locations therein.

The bottom portion of the connector is provided with a first group of holes that house the optical transducers in operative alignment with the bottoms of predetermined ones of the site connector pins. A second group of holes in the bottom portion includes the optical cables that couple the chip's I/O pads to selected circuits and/or devices. The top and bottom connector portions are joined together by suitable means.

22 Claims, 5 Drawing Figures

CONNECTOR IMPLEMENTED WITH FIBER OPTIC MEANS AND SITE THEREIN FOR INTEGRATED CIRCUIT CHIPS

BACKGROUND OF THE INVENTION

1. Field of the Invention

This invention is directed to the packaging of integrated electronic chips. It is concerned, more particularly, with the direct packaging of such chips using light as the transmission medium for effecting interconnection to other circuits and/or devices.

2. Description of the Prior Art

Assorted packaging techniques and arrangements for connecting high density electronic circuit chips to other circuits or devices are well known in the prior art. Since their first commercial appearance, the constantly increasing circuit density of such chips applied continual pressure to those faced with solving the problems of making connections to appropriate points of all of the involved circuits in the diminishing space allowed therefor. As circuit density and heat generation in the modern electronic circuit chip increased, newer packaging techniques were attempted in an effort to overcome the problems posed by the challenge to place the most sophisticated electronic system in the smallest possible package.

Furthermore, the trend in integrated circuit fabrication toward multi-function chips by itself caused a dramatic increase in the number of eventual interconnections in the wiring network, printed circuit board or package in which the newer chips were to be used. In addition, the desire to increase rates of information processing and transfer compounded chip connection problems in that the number of permissible input/output (I/O) connections needed to obtain such higher rates were limited by the switching noise they would cause when utilized. Obviously, the switching of a large number of I/O connections at one time would cause sufficiently high levels of signal and switching noise to thereby adversely affect proper chip operation. While this problem was partially resolved by sequencing chip I/O operation, or by resorting to equivalent techniques, such solutions required additional circuitry and resulted in slower operation which fell far short of advantageously and fully using the denser chip capabilities.

Thus, the trend toward more extensive miniaturization, ever increasing circuit densities, higher transmission rates and greater processing speeds brought about reductions in available space for chip interconnections. This, in turn, caused a reduced sensitivity to signal interference, particularly I/O switching noise, as various attempts to accommodate the smaller interconnection space were made. Also, such interconnection requirements made it difficult, if not impossible, to effect field repair or to simply replace obsoleted chips. As a result, there arose a great need to provide more versatile chip packaging concepts which would accommodate the newest chips as they became available without unduly limiting the number of I/O connections that could be made thereto without interfering with relatively fast and easy field chip replacement.

U.S. Pat. No. 3,879,606, which issued to K. E. Bean, teaches a packaging concept which couples semiconductor chips to one another by providing a light conducting path and light responsive elements in the chips themselves. As necessary, a light source is used to illuminate a given light path whereupon the light responsive semiconductor devices in that light path are actuated thereby coupling the desired devices. This capability was intended to avoid short circuits and/or stray capacitance problems in the chip package. U.S. Pat. No. 3,969,816, which issued to R. C. Swengel Sr., describes an interconnection system for bonded wires which utilizes optical conductors. Also of interest are the patents which issued to J. M. Cutchaw concerning leadless packages for high density integrated circuit chips. These patents (U.S. Pat. Nos. 3,904,262; 4,063,791; 4,164,003 and 4,166,665) represent a continuing effort to provide a readily demountable connector for chip packages which would meet current and future packaging demands, including those of chip cooling and interconnection.

Unfortunately, these and other similar prior art efforts were not fully effective in solving the aforementioned packaging problems. There still remained the I/O noise switching problem posed by the sheer number of interconnections to be made and the heat dissipation problem arising out of the power needs and usage of the modern multi-function chips. In addition, greater life expectancy for any chip packaging design was not achievable where each new chip generation spawned a host of packaging concepts which addressed only the immediate problems of a particular chip configuration. Furthermore, it became apparent that it would be highly beneficial to provide chip connectors which would be capable of handling the chips directly in a single level packaging approach rather than using chip packages or modules to which the external connections were made.

OBJECTS AND SUMMARY OF THE INVENTION

It is, therefore, an object of the present invention to provide a versatile packaging arrangement for a highly integrated circuit chip which will overcome the problem of effecting a great number of chip connections without concern for or limitation due to input/output noise switching problems.

It is also an object of the present invention to provide a packaging arrangement for highly integrated circuit chips which can effectively dissipate the heat generated by their operation while still permitting a great number of chip connections.

It is a further object of the present invention to provide a packaging arrangement for a highly integrated circuit chip which would promote relatively quick and easy chip field replacement, particularly for those chips requiring a great number of connections.

It is a further object of the present invention to provide a single level packaging arrangement which will therefore be relatively easy to implement and less costly and time consuming to employ.

These and similar objects are achieved by providing a unitary level of interconnection and apparatus incorporating the same for communicatively coupling highly integrated circuit chips to other circuitry and/or devices using fiber optic cables, at least in part, as the interconnection means. The chip itself is mounted in a connector having a heat reducing collar which is maintained in thermal contact with the chip by thermally conductive grease or the thermal equivalent thereof. The chip site is adapted so that the chip is easily wedged therein to establish and thereafter maintain contact between deformable chip pads and the site connection pads provided for that purpose in the connector. If needed, the site connection pads are coated with a conductive layer which resists the formation of any oxide or deleterious film thereon. Chip interchangeability is achieved by virtue of the solderless interconnections used and the site incorporated chip retention means which are strong enough to retain the chip in its connector, yet flexible enough to permit its removal when necessary. By shaping the overall site configuration to match that of a particular chip, the site itself can be made self-locating to further facilitate correct chip insertion and/or orientation therein.

BRIEF DESCRIPTION OF THE DRAWINGS

Referring now to the drawings wherein like reference numerals have been used in the several views to identify like elements.

DESCRIPTION OF THE PREFERRED EMBODIMENT

As used in this description, the terms "integrated circuit chip" or "chip" refer to modern integrated circuit packages commonly known as large scale integrated (LSI) or very large scale integrated (VLSI) circuits, which each contain enormous numbers of circuits, generally in the order of four to eight thousand circuits. Currently available high density integrated chips have an upper limit of between thirty-five and fifty I/O connections that can be switched at one time depending upon the number and type of driver circuits that are used.

The employment of fiber optics, on the other hand, in place of standard or conventional connection means, would permit at least two or more orders of magnitude of improvement in the number of tolerable I/O chip connections that can be simultaneously switched without adversely affecting chip operation. In addition, the use of fiber optic cables would significantly reduce the problem of signal attentuation if the mating connection points were remotely located and achieve a concomitant enhancement in signal transmission times. As used herein, the term "fiber optic cable" refers to a conventional fiber optic bundle of a single or multiple strands, either being formed, for example, from any one of the types described in the September 1978 issue of Electronic Products, at pages 39 to 51 thereof.

Figure 1:
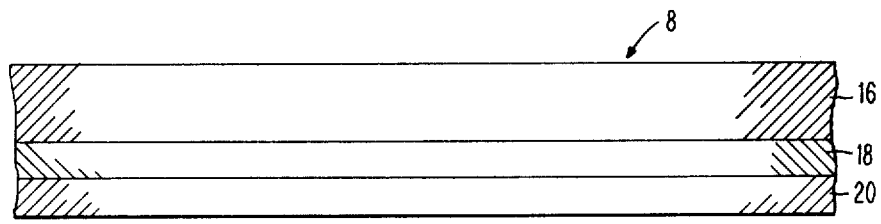
FIG. 1 illustrates a partial, cross-sectional view of the top portion of a multilayered connector prior to chip site creation therein in accordance with the present invention.

FIG. 1 schematically illustrates, in cross-section, the multi-layered top portion 8 of a connector 10 which is intended to accommodate a highly integrated chip 12 in a manner and by use of cooperating elements in a chip site 14 as will be hereinafter described. A multi-layered connector 10 is preferably utilized as a host for the integrated circuit chip 12 although it will be appreciated by those having skill in this art that the connector 10 could be fashioned from a solid, rather than a composite member. However, multi-layered are preferably used to reduce or eliminate eddy current and/or hysteresis effects. it is also felt that multi-layered connectors lend themselves more readily to cost effective and easy fabrication. Although only the portions of one connector 10 and one chip site 14 are shown in the various drawing figures for reasons of simplicity, it will also be appreciated by those having skill in this art that a plurality of sites could be provided for by similar connectors and an integrated circuit chip secured in each of the sites as will be hereinafter described with reference to a single chip and a site therefor.

Figure 2:
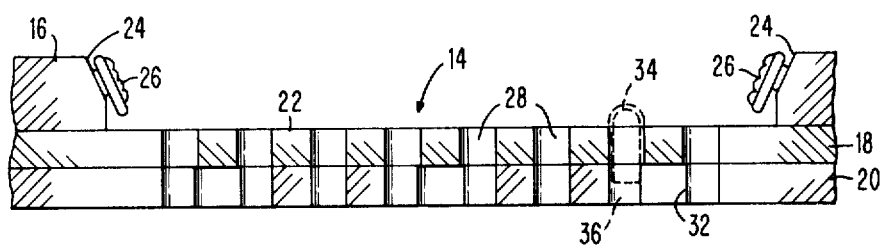
FIG. 2 depicts a partial, cross-sectional view of the FIG. 1 connector top portion having a chip site shown partially completed therein.

The top portion 8 of connector 10 comprises, in this example, three conductive layers 16, 18 and 20 which are joined or laminated together in a conventional manner. The chip site 14 is started by drilling or otherwise forming an opening in these topmost layers, as is shown in FIG. 2. This removes all of top layer 16 from the chip site 14 proper exposing a portion 22 of the top surface of middle layer 18. It should be noted that the shape of chip site 14 opening can be readily configured to match the configuration of the chip to be inserted therein, thus insuring quick and correct chip orientation at any time. Regardless of its particular outward configuration, the connector top portion 8 serves as a conductive collar having two distinct purposes. In this role, top portion 8 functions as a heat sink to remove heat generated during operation of the chip 12 from the site 14 and also serves to provide shielding from external signals that might otherwise interfere with proper chip operation. The topmost layer 16 is then provided with a beveled shoulder 24, as is shown in FIG. 2, against which a wedge 26 is to be glued or fastened for a purpose to be described. The wedge 26 is preferably formed of an insulative material strip or strips of appropriate thickness, such as polyester or polyimide, having the characteristics set forth hereinafter. Thus, the wedge 26 can be formed of any suitable material having said requisite characteristics, such as, for example, the polyester Mylar or the polyimide Keptan, either of which can be obtained from E. I. DuPont, Inc. It is secured in place by either a sufficient amount of an acrylic polymer adhesive or by conventional mechanical means, such as a pin or staple.

A plurality of holes 28 are drilled in the bottom of the chip site 14, extending completely through the conductive layers 18 and 20. The exposed surface 22 of middle layer 18 and the walls of holes 28 are then coated with an insulating layer 30 of a suitable material such as polyimide. Insulating layer 30 is placed over the entire exposed surface of the conductive middle layer 18 and partway up the shoulder 24 of the topmost layer 16, as is shown most clearly in FIG. 3. A series of holes 32 are now formed only in bottom layer 20 between only some predetermined holes 28 for a purpose to be described. Holes 32, where formed, extend fully between holes 28, removing the insulating layer 30 from the lower portions thereof to the height of layer 20. The holes 28 are fitted with electrically conductive site connector pins 34 which are wedged tightly therein and extend downwardly either completely to the bottom surface of layer 20 or partway leaving a cavity 36 near the bottom of the holes 28 that they occupy. The pads or heads 38 of the site connector pins 34 are dome-shaped and extend into the upper portion of chip site 14 above the middle layer 18. The site connector pins 34, including their pads 38, are made of a conductive material, such as copper and possibly one or more additional materials alloyed therewith to obtain desired pin characteristics. A satisfactory mix of 99.75% copper and 0.20% zirconium, the remaining 0.05% being metallic impurities, has been used for pins of the type described herein. Alternatively, the site connector pads 38 can be made of a readily deformable material such as, for example, a lead alloy of tin or indium such as that used for the chip connector pads. The use of a deformable pad or controlled collapse interconnection means is similar to, but somewhat different than the techniques and attendant details thereof which are described in the several articles on that subject which appeared in the IBM Journal of Research and Development, Vol. 13, No. 1, May 1969, at pages 225 to 296 thereof. In this particular instance of a controlled collapse means for at least the chip connector pads, wet solder reflow of the pads is not contemplated, although possible if the proper pad material is used. The pads 38 are provided with a tarnish or oxide resistant coating 40, such as gold, to prevent oxide buildup and subsequent interference with connection integrity.

A plurality of optical transducers 42, in the preferred embodiment these are Emitter-Receivers for Optical Systems or EROS, are inserted, one each, in the holes 32. The EROS 42 is a dual purpose element which will generate a light signal in response to an impinging electrical signal when acting in its emitting mode and do the converse when acting in its receiving or detection mode. Further and more specific details on the nature and performance of an EROS device are available and can be found, for example, in the Feb. 5, 1979 issue of Electronic Design News, at pages 72 to 76 thereof. It will be appreciated by those having skill in this art that single purpose transducers could have been employed herein, that is, separate emitters and receivers could have been used, but that would obviously have increased the number and cost of elements utilized as well as the cost of preparing the chip site 14 to accommodate this increased number.

Figure 3:
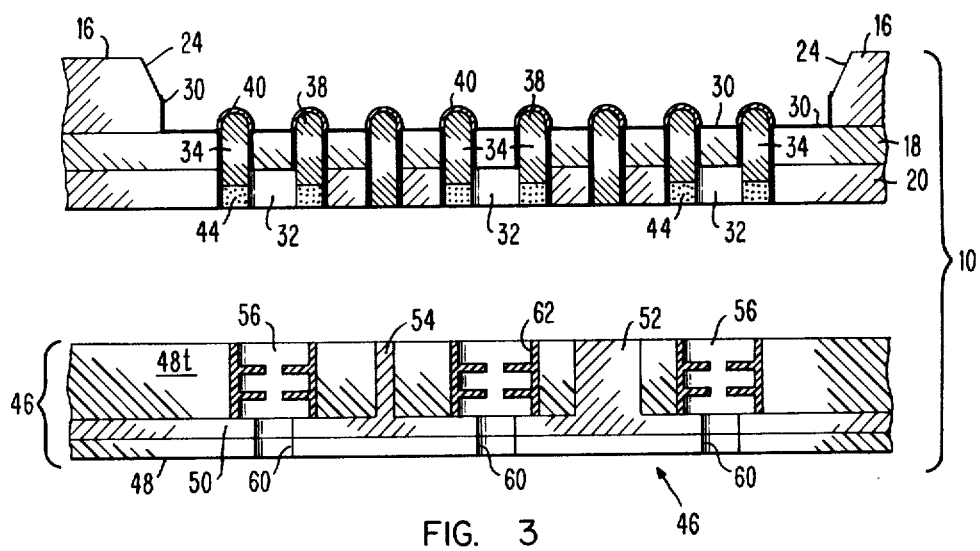
FIG. 3 shows another partial, cross-sectional view of the FIG. 1 connector top portion having a chip site in an advanced state of completion depicted therein adjacent a connector bottom portion which is shown in a preparatory state of completion.

The top portion 8 of connector 10, when viewed from the underside thereof, has two groups of holes that are both visible and accessible therefrom. The first group is the holes 28 which are either fully or partially filled with site connector pins 34. The partially filled holes 28 leave their bottom cavities 36 exposed from below the connector top portion 8. The second group is the holes 32 which, as can be seen in FIG. 3, have been formed in layer 20 between only those holes 28 which are partially filled with site connector pins 34. In other words, holes 32 are formed only between the visible cavities 36. The cavities 36 are then filled with thermal grease 44 which serves to conduct heat out of the interior of the connector 10. The bottom surface of the connector top portion 8 is then covered or sealed with an insulating layer 45, identical to protective coating 30, leaving the bottoms of the site connector pins 34 and the EROS 42 exposed, but trapping the thermal grease 44 in cavities 36.

Figure 4:
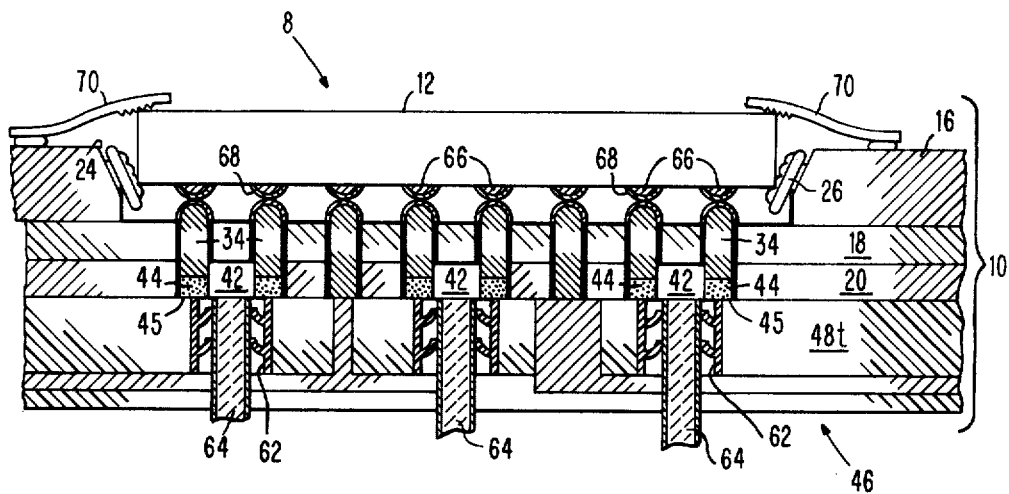
FIG. 4 illustrates a partial, cross-sectional view of the FIG. 3 connector top portion having a completed chip site shown holding a chip therein and of the FIG. 3 connector bottom portion shown in a completed state, both portions being operatively joined together.

The top portion 8 of connector 10 is then mated with a base portion 46, which can be an independent element that is bonded, pinned or clamped thereto. Base portion 46 can alternatively and preferably be fashioned in or from a conventional printed circuit board. The base portion 46, when implemented as a printed circuit board, is fabricated from multiple insulative layers 48 and conductive layers 50 as shown in FIGS. 3 and 4. The insulating layers 48 are generally made of a resin impregnated fiber glass cloth which has been satisfactorily cured in a known fashion. The conductive layers 50, from which the printed circuit leads for buses 52 and 54 are configured, are typically fashioned from copper foil. As contemplated in the preferred embodiment of the present invention, the base 46 is fabricated, if a printed circuit board, in a conventional manner with an appropriate number of signal or power planes separated by insulating and conductive layers. The specific details of one example of circuit board fabrication can be found in the commonly assigned U.S. Pat. No. 4,030,190.

A series of holes 56 are drilled or formed in and completely through the topmost insulating layer 48t. The holes 56 are formed so that they will be in coaxial alignment with holes 32 and the EROS 42 when base 46 is mated with the remainder of the connector 10. One hole 56 is drilled for each of the holes 32 that contain an EROS 42 therein. Another series of holes 60 are drilled in the base portion 46 and extend therein in generally coaxial alignment with the holes 56. Optic cable retainers 62 are locked, one each, into holes 56 and a fiber optic cable 64 is, in turn, locked in each of the retainers 62. The cables 64 are positioned in communicative contact with the EROS 42 transducers and extend therefrom back into the base 46 through holes 60 to the circuits and/or devices (not shown) to which connection with the chip is desired.

The chip 12 itself lacks the conventional input/output or I/O pin connections and is fitted instead with an appropriate number of chip pads 66 which are made of a deformable lead alloy having a protective, conductive coating 68, similar to coating 40, thereon. Upon insertion of the chip 12 into the site 14, the site connector pads 38 and the chip connector pads 66 are pressed into a self-defining fit which is set up in part and maintained by the action of the wedge 26 on the sides of the chip 12. Once in place, the chip 12 is held secure by adhering strips 70 of polyester or polyimide (see the examples of usable materials given previously) to the topmost layer 16 of connector 10, which strips extend over and restrain the top of the chip 12. The retaining strips 70 are preferably of about 15 mil thickness and have been found to exhibit sufficient tension to secure the chip 12 in place and to maintain the site connector pads 38 and the chip pads 66 in effective contact. The retaining strips 70 are glued in place using a suitable acrylic polymer adhesive such as Isotac made by the 3M Corporation. They could alternatively be fastened in place using any suitable mechanical means, such as a rivet, pin or staple.

Figure 5:
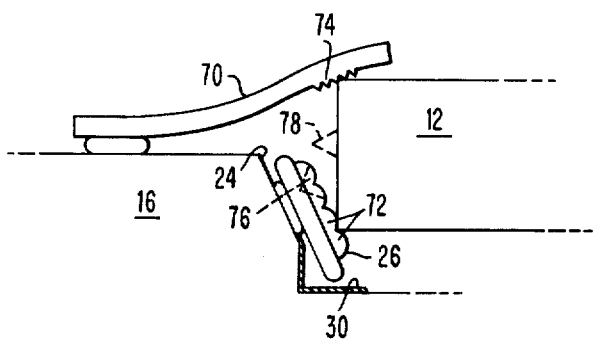
FIG. 5 shows a schematic view of an integrated circuit chip that has been captured in the chip site and the retention means therefor.

As shown in FIGS. 4 and 5, the surfaces of the wedge 26 and of the retaining strips 70 which contact the chip 12 can each be provided with a locking enhancement. The locking enhancement may be a series of deformable projections 12, formed on the chip contacting surface of wedge 26, that would engage a corner of the chip 12 when it is pressed down into the chip site 14 into contact with the site pads 38. Alternatively or in addition thereto, the locking enhancement might be a series of rigid rachetlike projections 74, formed on the chip contacting surface of retaining strip 66, that would bias the chip 12 to a secured nesting positon. It would also be possible, as depicted in dashed lines in FIG. 5, to provide a notch 76 in wedges 26 that would retain therein a mating projection 78 formed on or affixed to the sides of the chip 12. It will be understood by those skilled in this art that the same effect could be obtained by reversing the respective sites of the notch 76 and projection 78.

In operation, a properly seated chip 12 will work in the following manner. Most chip input and output signals, those having signal levels that are compatible with optical transmission, will be carried by the same fiber optic assembly due to the dual nature, previously explained, of the EROS 42 used for that purpose in connector 10. These optically forwarded input signals to the chip 12 will be carried by a pair of vertically adjacent connector pads 38 and 66 with the output signals being carried by another set of vertically adjacent connector pads from chip 12 to the optical cable 64. Where signals are too high to be transmitted via optical cable, such as the case of power bus signals, they will be brought to and carried from site 14 in a conventional manner by the printed circuit portions 52 and 54. Due to the limited, but sufficient flexibility of the retaining strips 70, the chip 12 is permitted to "float" as the connector pads 38 and 66 undergo thermal expansion.

The heat generated by the chip 12 is carried directly from the connector pads 38 and 66 by the thermal grease 44 to the conductive layer 20 and by convection to all of the conductive layers 16, 18 and 20 to provide chip cooling. In this manner, the chip 12 can be accommodated with little concern for the negative effects of thermal stress or loading. In addition, there is no adverse effect upon performance arising out of I/O switching noise due to the optical coupling which is employed. Thus, the chip site 14 and coupling means provided therefor in accordance with the present invention avoids many of the problems associated with connection of high density circuit packages in and to a printed circuit board.

While the present invention has been described in the context of a preferred embodiment thereof, it will be readily apparent to those skilled in the appertaining art, that modifications and variations can be made therein without departing from the spirit and scope of my invention. Accordingly, it is not intended that the present invention be limited to the specifics of the foregoing description of the preferred embodiment. Instead, the present invention should be considered as being limited solely by the appended claims which alone are intended to define its scope.

Having thus described my invention, what I claim as new and desire to secure by Letters Patent is:

1. Apparatus for detachably connecting a high density, integrated circuit chip having deformable chip connection pads thereon within said apparatus and for coupling said chip pads to predefined connection points, said apparatus comprising:
   (a) a top portion including a distinct conductive layer at the top thereof, said conductive layer having an opening formed therein which extends partially through said conductive layer;
   (b) a floor at the bottom of said top portion opening having a first plurality of holes formed therein which extend from said floor completely through the remainder of said top portion and a second plurality of holes also formed in the remainder of said top portion between predetermined ones of said first plurality of holes and extending from the bottom of and partially upward into said top portion;
   (c) a plurality of conductive site connection pins mounted one each in said first plurality of holes, said pins including connection pads at the head thereof, said pads extending upwardly from said floor toward said opening;
   (d) a bottom portion including an upper insulating layer and at least one conductive layer thereberneath which includes printed circuit leads formed therein, said insulating layer having a third plurality of holes formed therethrough and said bottom portion conductive layer having a fourth plurality of holes formed therein coaxial with each one of said third plurality of holes;
   (e) a plurality of light transmission means mounted one each in said fourth plurality of holes and extending therefrom to said connection points;
   (f) a plurality of optical transducers, mounted one each in operative association with one of said site connection pins and one of said light transmission means in predetermined ones of said third plurality of holes, for converting electrical signals received from its said associated site connection pin into light signals suitable for transmission along its associated light transmission means to at least one of said remote connection points;
   (g) a plurality of optical transducers, mounted one each in operative association with one of said site connection pads and one of said light transmission means in predetermined ones of said third plurality of holes, for converting light signals received from its said associated light transmission means and at least one of said remote connection points into electrical signals suitable for use in the chip by applying said electrical signals to its associated site connection pin; and
   (h) chip retention means, secured to said apparatus at the top of said opening, for retaining a chip in said opening with said site connection pads and said chip connection pads operatively coupled to each other.

2. The apparatus according to claim 1 wherein said conductive layer of said top portion is provided with a shoulder at least partially around the edge perimeter of said opening.

3. The apparatus according to claim 2 wherein said chip retention means includes a first plurality of strips of plastic material of predetermined thickness and means for fastening said strips to said shoulder.

4. The apparatus according to claim 3 wherein said first plurality of strips each include deformable projection means on the chip contacting surface thereof which tend, when firmly pressed against by said chip upon its insertion, to lock said chip within said opening.

5. The apparatus according to claim 4 wherein said chip retention means includes a second plurality of strips of plastic material of predetermined thickness and flexibility and means for fastening said strips to the top of said conductive layer of said top portion with said strips extending therefrom out over and in restraining contact with the top of said chip.

6. The apparatus according to claim 5 wherein said second plurality of strips each include deformable projection means on their surfaces which contact said chip which tend, when said chip is in proper position within said opening, to lock said chip therewithin.

7. The apparatus according to claim 6 wherein said site connection pins only partially fill said first plurality of holes in which they are located leaving a cavity at the bottom thereof and which further includes thermal conductive fluid situated in and completely filling said cavity in each of said first plurality of holes below said site connection pin.

8. The apparatus according to claim 7 which additionally comprises a conductive oxide resistant permanent coating applied over each of said pads of said plurality of site connection pins.

9. The apparatus according to claim 1 wherein said site connection pins only partially fill said first plurality of holes in which they are located leaving a cavity at the bottom thereof and which further includes thermal conductive fluid situated in and completely filling said cavity in each of said first plurality of holes below said site connection pin.

10. The apparatus according to claim 9 which additionally comprises a conductive oxide resistant permanent coating applied over each of said pads of said plurality of site connection pins.

11. The apparatus according to claim 1 which additionally comprises a conductive oxide resistant permanent coating applied over each of said pads of said plurality of site connection pins.

12. Apparatus for detachably connecting a high density, integrated circuit chip having deformable chip connection pads thereon within said apparatus and for coupling said chip pads to predefined connection points, said apparatus comprising:
 (a) a top portion including a distinct conductive layer at the top thereof, said conductive layer having an opening formed therein which extends partially through said conductive layer;
 (b) a floor at the bottom of said top portion opening having a first plurality of holes formed therein which extend from said floor completely through the remainder of said top portion and a second plurality of holes also formed in the remainder of said top portion between predetermined ones of said first plurality of holes and extending from the bottom of and partially upward into said top portion;
 (c) a plurality of conductive site connection pins mounted one each in said first plurality of holes, said pins including connection pads at the head thereof, said pads extending upwardly from said floor toward said opening;
 (d) a bottom portion including an upper insulating layer and at least one conductive layer therebeneath which includes printed circuit leads formed therein, said insulating layer having a third plurality of holes formed therethrough and said bottom portion conductive layer having a fourth plurality of holes formed therein coaxial with each one of said third plurality of holes;
 (e) a plurality of light transmission means mounted one each in said fourth plurality of holes and extending therefrom to said connection points;
 (f) a plurality of dual function optical transducers, mounted one each in operative association with at least one of said site connection pins and at least one of said light transmission means in predetermined ones of said third plurality of holes, for converting electrical signals received from its said associated site connection pin into light signals suitable for transmission along its associated light transmission means to at least one of said remote connection points or for converting light signals received from its said associated light transmission means and at least one of said remote connection points into electrical signals suitable for use in said chip by applying said electrical signals to an associated site connection pin; and
 (g) chip retention means, secured to said apparatus at the top of said opening, for retaining a chip in said opening with said site connection pads and said chip connection pads operatively coupled to each other.

13. The apparatus according to claim 12 wherein said conductive layer of said top portion is provided with a shoulder at least partially around the edge perimeter of said opening.

14. The apparatus according to claim 13 wherein said chip retention means includes a first plurality of strips of plastic material of predetermined thickness and means for fastening said strips to said shoulder.

15. The apparatus according to claim 14 wherein said first plurality of strips each include deformable projection means on the chip contacting surface thereof which tend, when firmly pressed against by said chip upon its insertion, to lock said chip within said opening.

16. The apparatus according to claim 15 wherein said chip retention means includes a second plurality of strips of plastic material of predetermined thickness and flexibility and means for fastening said strips to the top of said conductive layer of said top portion with said strips extending therefrom out over and in restraining contact with the top of said chip.

17. The apparatus according to claim 16 wherein said second plurality of strips each include deformable projection means on their surfaces which contact said chip which tend, when said chip is in proper position within said opening, to lock said chip therewithin.

18. The apparatus according to claim 17 wherein said site connection pins only partially fill said first plurality of holes in which they are located leaving a cavity at the bottom thereof and which further includes thermal conductive fluid situated in and completely filling said cavity in each of said first plurality of holes below said site connection pin.

19. The apparatus according to claim 18 which additionally comprises a conductive oxide resistant permanent coating applied over each of said pads of said plurality of site connection pins.

20. The apparatus according to claim 12 wherein said site connection pins only partially fill said first plurality of holes in which they are located leaving a cavity at the bottom thereof and which further includes thermal conductive fluid situated in and completely filling said cavity in each of said first plurality of holes below said site connection pin.

21. The apparatus according to claim 20 which additionally comprises a conductive oxide resistant permanent coating applied over each of said pads of said plurality of site connection pins.

22. The apparatus according to claim 12 which additionally comprises a conductive oxide resistant permanent coating applied over each of said pads of said plurality of site connection pins.

* * * * *